United States Patent
Han et al.

(10) Patent No.: US 12,400,872 B2
(45) Date of Patent: Aug. 26, 2025

(54) SACRIFICIAL CAPPING LAYER FOR GATE PROTECTION

(71) Applicant: Tokyo Electron Limited, Tokyo (JP)

(72) Inventors: Yun Han, Albany, NY (US); David L O'Meara, Albany, NY (US); Cheryl Alix, Albany, NY (US); Andrew Metz, Albany, NY (US); Shan Hu, Albany, NY (US); Henan Zhang, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 605 days.

(21) Appl. No.: 17/724,088

(22) Filed: Apr. 19, 2022

(65) Prior Publication Data

US 2022/0344169 A1     Oct. 27, 2022

Related U.S. Application Data

(60) Provisional application No. 63/179,098, filed on Apr. 23, 2021.

(51) Int. Cl.
*H01L 21/311*     (2006.01)
*H01L 21/02*     (2006.01)
(Continued)

(52) U.S. Cl.
CPC .. *H01L 21/31144* (2013.01); *H01L 21/02186* (2013.01); *H01L 21/0228* (2013.01);
(Continued)

(58) Field of Classification Search
CPC ......... H01L 21/31144; H01L 21/02186; H01L 21/0228; H01L 21/31116; H01L 21/76802;
(Continued)

(56) References Cited

U.S. PATENT DOCUMENTS 10,037,884 B2 * 7/2018 Ou .................... H01L 21/02266
10,497,858 B1 * 12/2019 Ahn ...................... G11C 11/161
(Continued)

OTHER PUBLICATIONS

Korean Intellectual Property Office, International Search Report and Written Opinion for International application No. PCT/US2022/025969, mailed Aug. 11, 2022, 8pp.

*Primary Examiner* — Dale E Page
*Assistant Examiner* — Cristian A Tivarus
(74) *Attorney, Agent, or Firm* — Oblon, McClelland, Maier & Neustadt, L.L.P.

(57) ABSTRACT

A method includes providing a substrate including metal gate stacks and source/drain contact regions in alternating arrangement along a surface of the substrate with a dielectric spacer separating each source/drain contact region from adjacent metal gate stacks. Each source/drain region is recessed within an opening between adjacent metal gate stacks such that source/drain contact regions provide a bottom of the recess and dielectric spacers provide sidewalls. The etch stop layer is formed on the substrate such that it conformally covers the metal gate stacks, the sidewalls and the bottom of each recess, and a sacrificial layer is formed over each of the metal gate stacks and on at least a portion of each sidewall. The etch stop layer is removed from the bottom of each recess to expose the source/drain contact, and the sacrificial layer is then removed from the metal gate stacks and the sidewalls of each recess.

20 Claims, 8 Drawing Sheets

(51) Int. Cl.
 *H01L 21/768* (2006.01)
 *H10D 30/01* (2025.01)
 *H10D 30/62* (2025.01)
 *H10D 64/01* (2025.01)

(52) U.S. Cl.
 CPC .. *H01L 21/31116* (2013.01); *H01L 21/76802* (2013.01); *H01L 21/76831* (2013.01); *H10D 30/024* (2025.01); *H10D 30/6219* (2025.01); *H10D 64/017* (2025.01)

(58) Field of Classification Search
 CPC ......... H01L 21/76831; H01L 29/41791; H01L 29/66545; H01L 29/66795; H01L 21/76897; H01L 29/7848; H01L 2221/1063
 See application file for complete search history.

(56) References Cited

U.S. PATENT DOCUMENTS

| | | |
|---|---|---|
| 2004/0171201 A1 | 9/2004 | Gambino et al. |
| 2006/0183277 A1 | 8/2006 | Brask et al. |
| 2007/0161169 A1* | 7/2007 | Belyansky ........ H01L 29/66772 257/E21.415 |
| 2016/0268312 A1 | 9/2016 | Wang et al. |
| 2016/0293838 A1* | 10/2016 | Swaminathan ... H01L 21/02186 |
| 2016/0372324 A1* | 12/2016 | Kao .................... H01L 21/0337 |
| 2017/0047253 A1* | 2/2017 | Park .................. H01L 21/31105 |
| 2019/0140066 A1* | 5/2019 | Lee .................... H01L 29/0673 |
| 2020/0098919 A1 | 3/2020 | Peng et al. |
| 2020/0168464 A1 | 5/2020 | Loh |

* cited by examiner

SACRIFICIAL CAPPING LAYER FOR GATE PROTECTION

CROSS-REFERENCE TO RELATED APPLICATIONS

The present disclosure claims the benefit of U.S. Provisional Application No. 63/179,098 filed Apr. 23, 2021, which is incorporated herein by reference in its entirety.

TECHNICAL FIELD

The present invention relates generally to semiconductor device fabrication, and more particularly, to methods for forming a sacrificial capping layer for gate protection.

BACKGROUND

Advancement in semiconductor technologies relies on continued improvement in manufacturing fabrication technology. Innovation in semiconductor technologies has resulted in the introduction of new types of structures such as FinFET devices, stacked structures (e.g., 3D NAND devices). However, these new structures introduce a need for new fabrication schemes to overcome, what would otherwise be, debilitating manufacturing challenges. The present inventors recognized one such challenge which arises from damage to cap layers as well as erosion of spacers on gate sidewalls as a result of semiconductor plasma processing techniques. For instance, a dry etch process such as reactive Ion etching (RIE) may be used to open contacts within traditional middle-of-line (MOL) process flow. Often, the dry etch process can be quite aggressive for some layers within a semiconductor process flow. Typically, the dry etch process possesses a plasma source that generates a sea of ions that accelerate in a manner that causes ion bombardment against sensitive device layers. Resultantly, the plasma etch processes may cause damage to the underlying material, especially when opening high aspect ratio contact holes. This damage to the underlying material can then lead to uncontrolled variations in device electrical performance, as well as yield loss.

SUMMARY

The present disclosure relates to a semiconductor device, and a method of manufacturing a semiconductor device.

An aspect (1) provides a method including providing a substrate including a plurality of metal gate stacks and a plurality of source/drain contact regions in alternating arrangement along a surface of the substrate with a dielectric spacer separating each source/drain contact region from an adjacent metal gate stack. Each of the source/drain regions is recessed within an opening between adjacent metal gates stacks such that the source/drain contact regions provide a bottom of the recess and the dielectric spacers provide sidewalls of the recess. The etch stop layer is formed on the substrate such that the etch stop layer conformally covers the plurality of metal gate stacks, the sidewalls of each recess and the bottom of each recess, and a sacrificial layer is formed over each of the metal gate stacks and on at least a portion of each sidewall of each recess. The etch stop layer is removed from the bottom of each recess to expose the source/drain contact, and the sacrificial layer is then removed from each of the metal gate stacks and from the sidewalls of each recess.

An aspect (2) includes the method of aspect (1), wherein the forming a sacrificial layer includes forming the sacrificial layer having a first thickness on top of each metal gate stack and a second thickness on the sidewalls of each recess, the first thickness being greater than the second thickness.

An aspect (3) includes the method of aspect (1), wherein the forming a sacrificial layer includes forming the sacrificial layer on each sidewall such that a thickness of the sacrificial layer decreases from the upper portion of the recess toward the bottom of the recess.

An aspect (4) includes the method of aspect (1), wherein the forming a sacrificial layer includes preferentially forming the sacrificial layer on top of each metal gate stack relative to sidewalls of each recess.

An aspect (5) includes the method of aspect (4), wherein the preferentially forming the sacrificial layer includes performing an atomic layer deposition (ALD) process under processing conditions that reduce diffusion of reactant gases into the recesses.

An aspect (6) includes the method of aspect (5), wherein the processing conditions include at least one of concentrations of the reactant gases, gas exposure times, substrate temperature, and substrate rotation speed.

An aspect (7) includes the method of aspect (4), wherein the preferentially forming the sacrificial layer includes rotating the substrate while exposing the substrate to gas for forming the sacrificial layer.

An aspect (8) includes the method of aspect (7), further including setting a rotation speed of the substrate to provide a predetermined preferential deposition of the sacrificial layer on a top of each metal gate stack.

An aspect (9) includes the method of aspect (1), wherein the forming an etch stop layer includes forming a layer including silicon nitride, silicon oxide, or silicon oxynitride.

An aspect (10) includes the method of aspect (1), wherein the forming a sacrificial layer includes forming a layer including a metal oxide (MOx), a metal nitride (MNx), or a metal oxynitride.

An aspect (11) includes the method of aspect (4), wherein the preferentially forming a sacrificial layer includes forming a sacrificial capping layer having a thickness ranging from 0.5 nm to about 10 nm on the top of each metal gate stack.

An aspect (12) includes the method of aspect (11), wherein the preferentially forming a sacrificial layer includes forming a sacrificial capping layer having a thickness ranging from 2 nm to about 5 nm on the top of each metal gate stack.

Another aspect (13) provides a method including providing a substrate including a source/drain contact region, a replacement metal gate stack, a spacer on a sidewall of the replacement metal gate stack, and an etch stop layer on the spacer. A sacrificial capping layer is formed on the replacement metal gate stack, the sacrificial capping layer having a first thickness on top of the replacement metal gate stack and a second thickness on the etch stop layer, the first thickness being greater than the second thickness. The etch stop layer is removed using a plasma etching process, and the sacrificial capping layer is removed.

An aspect (14) includes the method of aspect (13), wherein the etch stop layer contains silicon nitride, silicon oxide, or silicon oxynitride.

An aspect (15) includes the method of aspect (13), wherein the sacrificial capping layer includes a metal oxide (MOx), a metal nitride (MNx), or a metal oxynitride.

An aspect (16) includes the method of aspect (13), wherein the sacrificial capping layer includes AlN, TiN, or TiOx.

An aspect (17) includes the method of aspect (13), wherein the substrate is rotated during the forming of the sacrificial capping layer.

An aspect (18) includes the method of aspect (13), wherein removing the sacrificial capping layer includes using a wet etch chemistry.

Another aspect (19) provides a method which includes providing a substrate including a source/drain contact region, a replacement metal gate (RMG) stack, a low-k spacer on a sidewall of the replacement metal gate stack, and an etch stop layer on the spacer. A sacrificial capping layer containing TiO2 is formed on the replacement metal gate stack, the sacrificial capping layer having a first thickness on top of the replacement metal gate stack and a second thickness on the etch stop layer, the first thickness being greater than the second thickness. The etch stop layer is removed using a plasma etching process, and the sacrificial capping layer is removed using wet etch chemistry.

An aspect (20) includes the method of aspect (19), wherein the forming a sacrificial capping layer includes preferentially deposited on the top of each the RMG stack by atomic layer deposition (ALD) using sequential exposures of titanium tetrakis(dimethylamido)titanium (TDMA) and ozone (O3) at a process pressure between about 1 Torr and about 3 Torr, a substrate temperature between about 100° C. and about 150° C., and a substrate rotation speed between about 10 RPM and about 50 RMP.

Note that this summary section does not specify every embodiment and/or incrementally novel aspect of the present disclosure or claimed disclosure. Instead, this summary only provides a preliminary discussion of different embodiments and corresponding points of novelty over conventional techniques. For additional details and/or possible perspectives of the present disclosure and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION OF ILLUSTRATIVE EMBODIMENTS

Figure 1A:
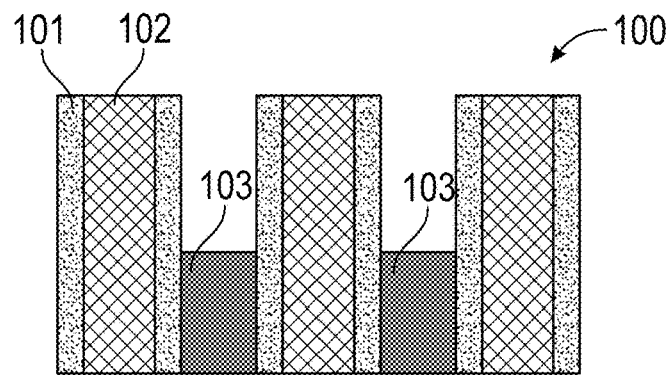
FIG. 1A illustrates a partial cross sectional fin view of a semiconductor device during fabrication along a direction of a fin.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present application disclose a method for preventing damage to semiconductor regions during plasma etching. The proposed integration scheme uses a sacrificial capping layer formed directly on top of a semiconductor region to be protected. This sacrificial capping layer is designed to protect the semiconductor region during the plasma etching process that would otherwise damage the semiconductor region. This sacrificial capping layer may be removed later in the process using a gentle wet clean process.

Embodiments of the application may be applied to various types of devices such as Fin transistors as well as stacked memory devices. Specific embodiments of the above process will be described using FIGS. 1-8 below.

Figure 1B:
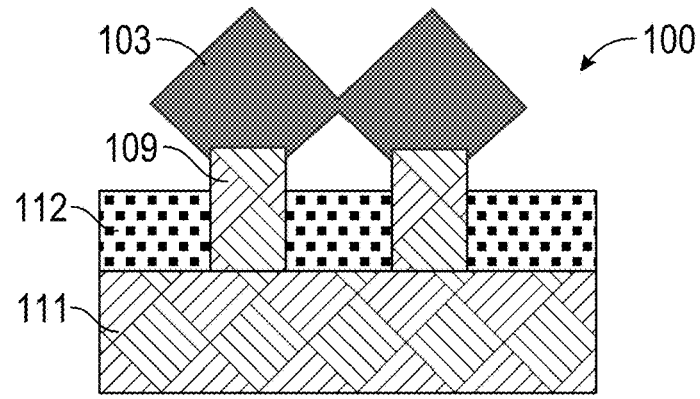
FIG. 1B shows a cross sectional gate view of the semiconductor device along a direction orthogonal to the direction of the fin, and in accordance with an example embodiment of the present disclosure.
Figure 1C:
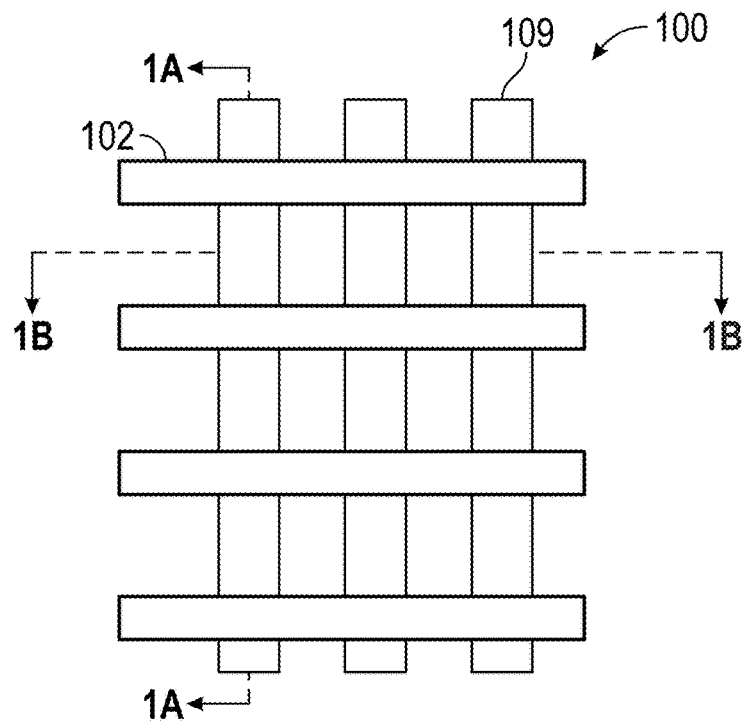
FIG. 1C illustrates a top view of the semiconductor in accordance with an example embodiment of the present disclosure.

FIG. 1A illustrates a partial cross sectional view of a semiconductor device during fabrication along a direction of a fin, and FIG. 1B shows a cross sectional view of the semiconductor device along a direction orthogonal to the direction of the fin. FIG. 1C illustrates a top view showing the cutline 1A-1A illustrated in FIG. 1A and cutline 1B-1B illustrated in FIG. 1B, all in accordance with an embodiment of the present invention. FIG. 1A is a partial cross sectional view and does not show the underlying fins and substrate.

As illustrated in FIGS. 1A-1C, at this stage of processing, the semiconductor device 100 has already gone through a substantial part of the front-end-of-the-line (FEOL) fabrication. For example, as illustrated in FIG. 1B, a transistor structure with a plurality of fins 109 is formed on the substrate 111.

In various embodiments, the substrate 111 may comprise silicon, silicon germanium, silicon carbide, and compound semiconductors such as gallium nitride, gallium arsenide, indium arsenide, indium phosphide, and others. The substrate 111 may comprise a semiconductor wafer that may include a semiconductor epitaxial layer including hetero epitaxial layers. For example, in one or more embodiments, one or more hetero epitaxial layers comprising a compound semiconductor may be formed over a semiconductor substrate. In various embodiments, a portion or an entirety of the substrate 111 may be amorphous, polycrystalline, or single-crystalline. In various embodiments, the substrate 111 may be doped, undoped, or contain both doped and undoped regions.

The plurality of fins 109 may be formed by epitaxial growth from the substrate 111 or alternatively using an etch back process leaving the plurality of fins 109. The plurality of fins 109 may be isolated from each other by shallow isolation regions 112. Accordingly, the shallow isolation regions 112 and the plurality of fins 109 may form an alternating pattern.

In one embodiment, the shallow isolation regions 112 may be formed by depositing an oxide fill material after patterning the plurality of fins 109, which is then planarized, for example, using a chemical mechanical planarization process. After a planarization, the shallow isolation regions 112 may be recessed so as to raise the plurality of fins 109.

A plurality of dummy gates 102 are formed over the substrate 111 and the plurality of fins 109. In one embodiment, the plurality of dummy gates 102 may be formed by patterning a layer of amorphous silicon or polysilicon deposited over the plurality of fins 109.

Next, a plurality of spacers 101 are formed on sidewalls of the plurality of dummy gates 102. The plurality of spacers 101 can be formed by depositing an insulating layer followed by an anisotropic etching process. For example, a reactive ion etch (ME) process may be used to form the spacers 101. The material of the insulating layer is chosen to be selectively not etched during the removal of the plurality of dummy gates 102 later in the process, e.g., immune to etching by chemical such as TMAH or $NH_4OH$. In one example, the spacers 101 can contain a low-k material.

Next, epitaxial regions 103 are grown over portions of the plurality of fins 109 located between the plurality of dummy gates 102 so as to form raised source/drain regions. The upper surface of the raised source/drain regions may form a faceted surface due to the growth pattern of the corresponding epitaxial material.

In one or more embodiments, the epitaxial regions 103 may be formed in a single epitaxial growth process. In other embodiments, the growth of the epitaxial regions 103 may consist of a multi-stage process. For example, it can begin with growing an initial epitaxial layer with a first doping on the plurality of fins 109 to a pre-determined thickness followed by the growth of a second layer with a second doping. For example, the second doping may be higher than the first doping. Similarly, the different layer may have different compositions of e.g., germanium or other compounds. The epitaxial growth process may use any type of epitaxial process including molecular beam epitaxy (MBE), or various types of chemical vapor deposition (CVD).

In one or more embodiments, the epitaxial regions 103 may be grown to introduce strain into the plurality of fins 109, for example, due to lattice mismatch.

In one or more embodiments, the source/drain (S/D) regions may be formed by doping the regions of the fins and the epitaxial regions 103, for example, with an implantation/anneal process.

Figure 2A:
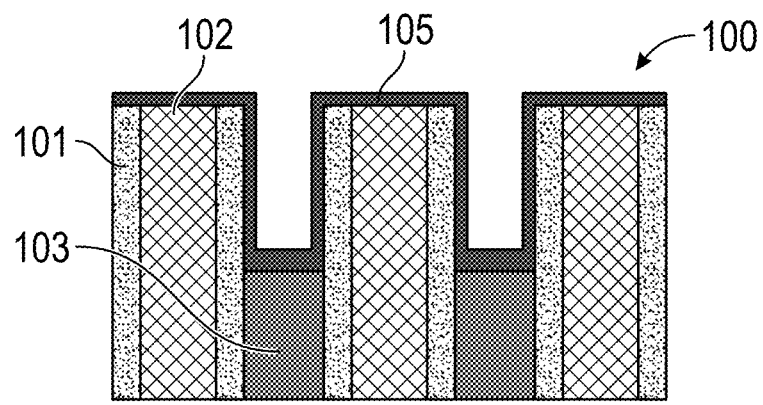
FIGS. 2A-2B illustrate cross sectional fin and gate views respectively of the semiconductor device during a subsequent stage of fabrication, in accordance with an example embodiment of the present disclosure.
Figure 2B:
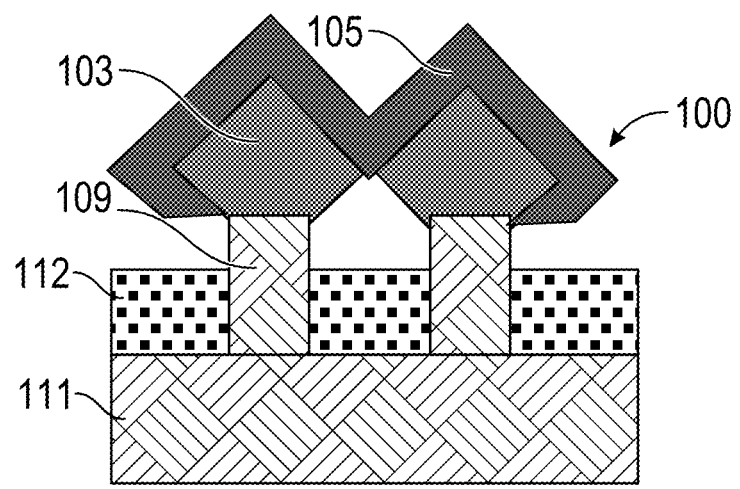

FIGS. 2A-2B illustrate a cross sectional view of the semiconductor device 100, during a subsequent stage of fabrication, after forming etch stop layer (ESL) 105 over the semiconductor device 100. FIG. 2A illustrates a cutline similar to FIG. 1A while FIG. 2B illustrates a cutline similar to FIG. 1B.

The ESL 105 may be conformally deposited across the entire wafer surface. In various embodiments, the ESL 105 comprises silicon nitride, silicon oxide, or silicon oxynitride. In various embodiments, the ESL 105 may have a thickness ranging from 0.5 nm to about 10 nm. In one embodiment, the ESL 105 may have a thickness ranging from 2 nm to about 5 nm.

Figure 3A:
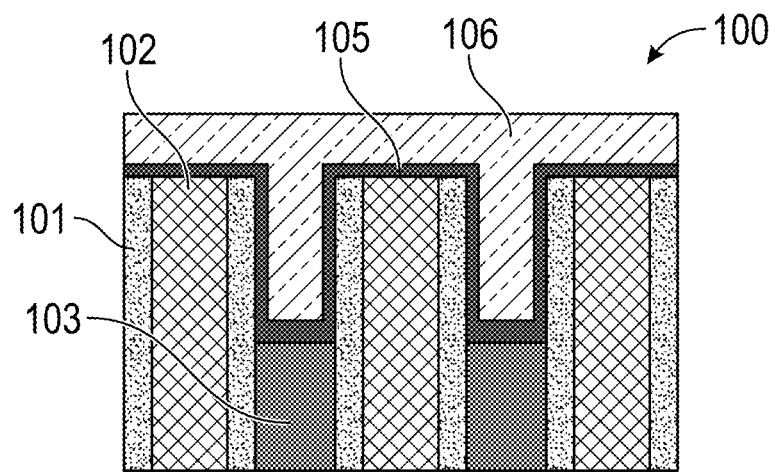
FIGS. 3A-3B illustrate cross sectional fin and gate views respectively of the semiconductor device during a subsequent stage of fabrication, in accordance with an example embodiment of the present disclosure.
Figure 3B:
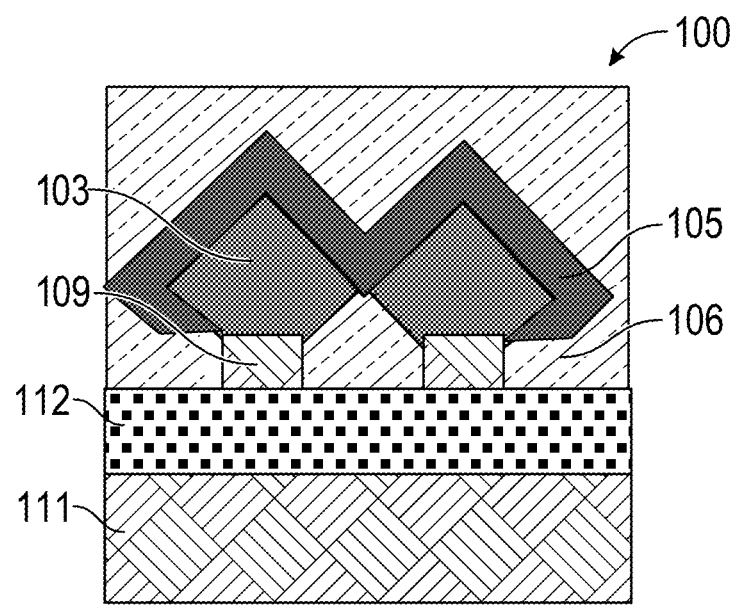

FIGS. 3A-3B illustrate partial cross sectional views of the semiconductor device 100 during fabrication after depositing an oxide 106 in accordance with an embodiment of the present invention. FIG. 3A illustrates a cutline similar to FIG. 1A while FIG. 3B illustrates a cutline similar to FIG. 1B.

Referring to FIGS. 3A and 3B, the oxide 106 is filled between the plurality of dummy gates 102. The oxide 106 is overfilled above the top surface of the ESL 105 and over the plurality of dummy gates 102.

In various embodiments of semiconductor device 100, the oxide 106 may be a flowable oxide including spin-on-glass. In one example, a layer comprising borophosphosilicate glass (BPSG), phosphosilicate glass (PSG), borosilicate glass (BSG), arsenic-silicon glass (ArSG), or other types of glass may be deposited and heated to reflow. In one or more embodiments, the oxide 106 may also comprise an oxide such as tetra ethyl oxysilane (TEOS), fluorinated TEOS (FTEOS), organo silicate glass (OSG), fluorinated silicate glass (FSG), or a spin-on glass (SOG).

Figure 4A:
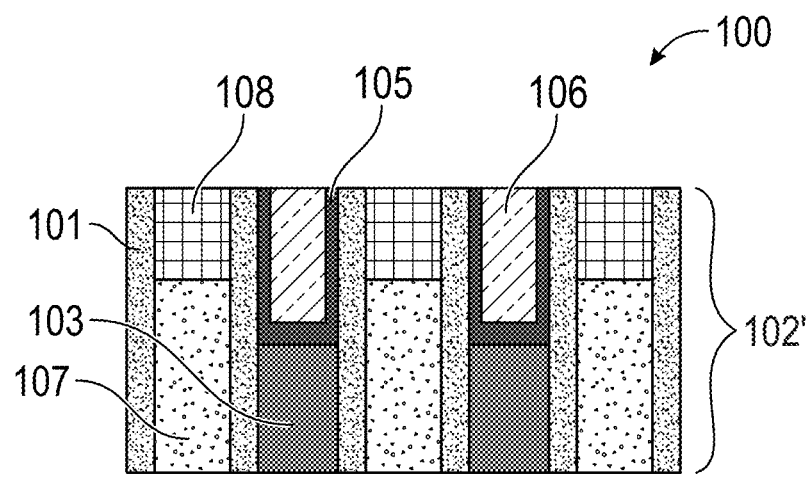
FIGS. 4A-4B illustrate cross sectional fin and gate views respectively of the semiconductor device during a subsequent stage of fabrication, in accordance with an example embodiment of the present disclosure.
Figure 4B:
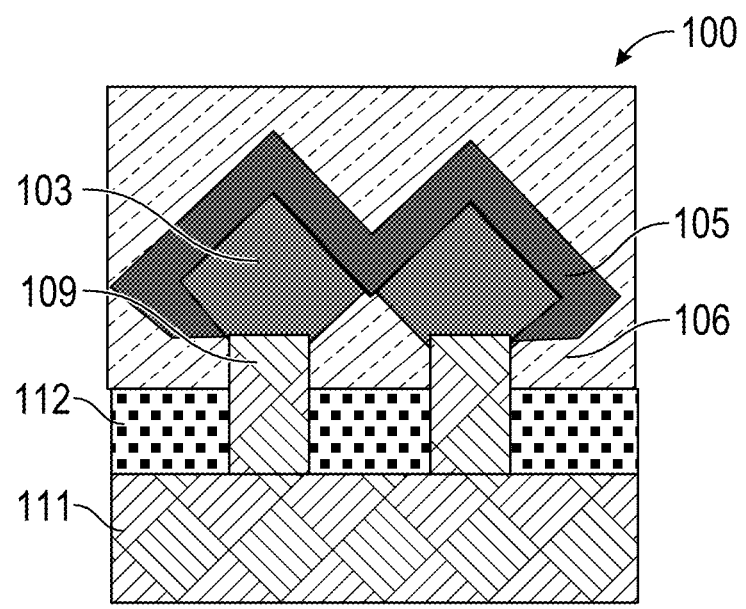

FIGS. 4A-4B illustrate a cross sectional view of the semiconductor device 100 during fabrication after forming a replacement metal gate (RMG) in accordance with an embodiment of the invention. FIG. 4A illustrates a cutline similar to FIG. 1A while FIG. 4B illustrates a cutline similar to FIG. 1B.

As illustrated in FIGS. 4A and 4B, the oxide 106 is planarized to expose the underlying ESL 105. The ESL 105 may be removed using an anisotropic etching process to expose the plurality of dummy gates 102. The plurality of dummy gates 102 is then removed, e.g., using a wet etch process or alternatively a plasma process. The spacer 101 retains the shape of the gate stack during the removal of the plurality of dummy gates 102. During the etching process, the oxide 106 protects the underlying regions of the epitaxial region 103.

After removing the plurality of dummy gates 102, the inner sidewalls of the plurality of spacers 101 are exposed leaving a cavity. This cavity is filled with a replacement gate material 107. After the replacement gate material 107 is in place, a contact cap 108 is formed. The contact cap 108 may be formed using a self-aligned process so as to form selectively only over the replacement gate material 107.

The replacement gate material 107 along with the contact cap 108 form the replacement metal gate (RMG) stack 102'. The RMG stack 102' helps to set the work function of the gate and forms the final gate electrode of the semiconductor device 100.

Figure 5A:
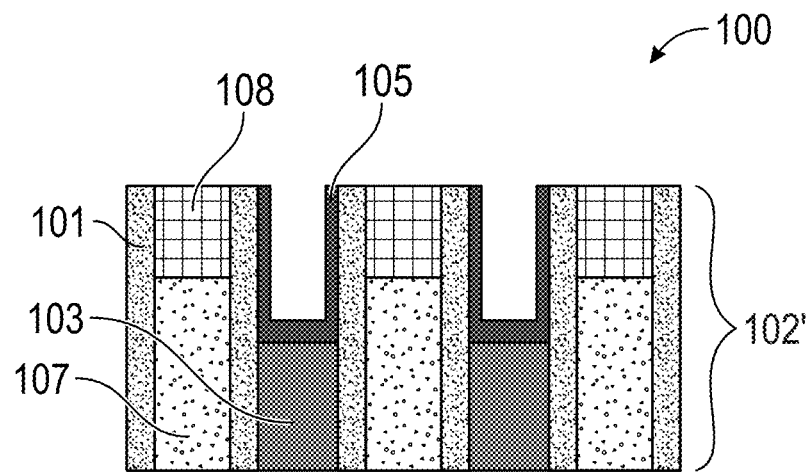
FIGS. 5A-5B illustrate cross sectional fin and gate views respectively of the semiconductor device during a subsequent stage of fabrication, in accordance with an example embodiment of the present disclosure.
Figure 5B:
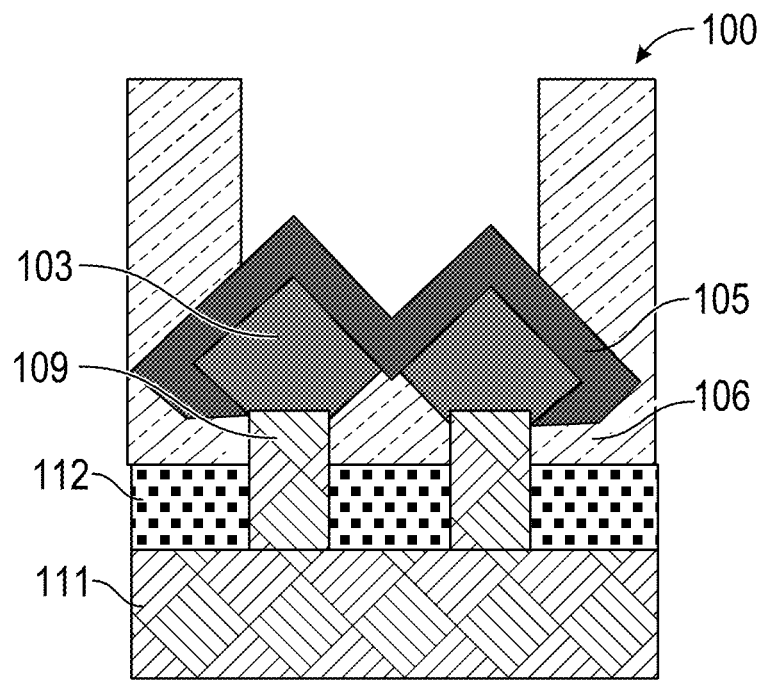

FIGS. 5A-5B illustrate partial cross sectional views of the semiconductor device 100 during a next stage of fabrication, after etching of the oxide 106, in accordance with an embodiment of the present invention. FIG. 5A illustrates a cutline similar to FIG. 1A while FIG. 5B illustrates a cutline similar to FIG. 1B.

As illustrated in FIG. 5A, the etching of the oxide 106 leaves empty, unfilled trenches or recessed features behind. In various embodiments, the oxide etch process may be a wet etch process, or a dry etch process such as reactive ion etch (RIE), or any process currently known within the art of semiconductor manufacturing. Etching the oxide 106 exposes the ESL 105 remaining between the plurality of spacers 101 that line the replacement gate material 107 and the contact cap 108.

Figure 6A:
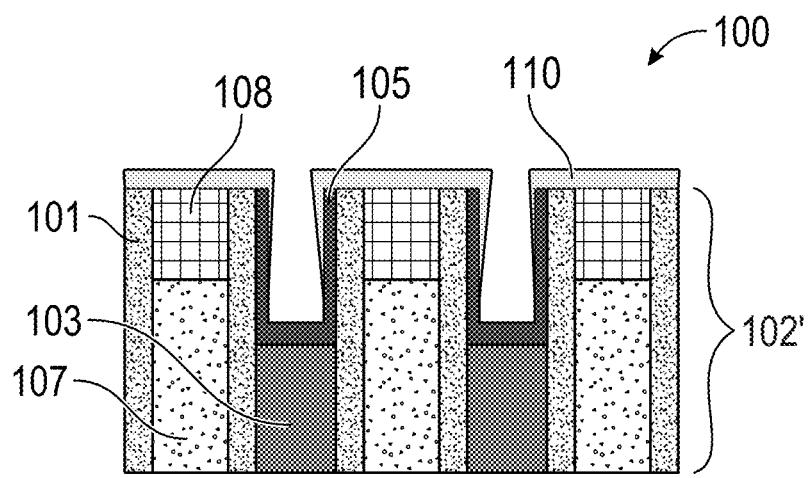
FIGS. 6A-6B illustrate cross sectional fin and gate views respectively of the semiconductor device during a subsequent stage of fabrication, in accordance with an example embodiment of the present disclosure.
Figure 6B:
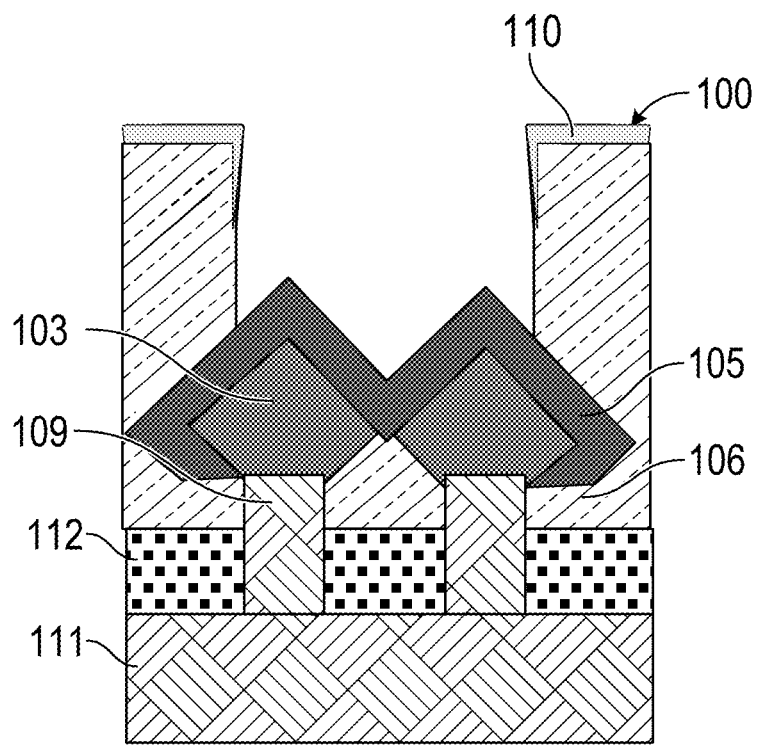

FIGS. 6A-6B illustrate partial cross sectional views of the semiconductor device 100 during a next stage of fabrication, after depositing a sacrificial capping layer 110, in accordance with an embodiment of the present invention. FIG. 6A illustrates a cutline similar to FIG. 1A while FIG. 6B illustrates a cutline similar to FIG. 1B.

The sacrificial capping layer 110 may be preferentially deposited on the top of the RMG stack 102' containing the contact cap 108 and the replacement gate material 107. As schematically depicted in FIGS. 6A-6B, a thickness of the sacrificial capping layer 110 can be greater on the contact cap 108 than on the ESL 105 on the spacer 101, and the thickness of the sacrificial capping layer 110 on the ESL 105 spacer 101 can decrease from the upper portion of the spacer 101 to the lower portion of the spacer 101. In various embodiments, the sacrificial capping layer 110 can include either metal oxides (MOx), metal nitrides (MNx), and metal oxynitrides such as, AlOx, AlN, TiN, TiOx, etc., where the "M" represents an elemental metal such as aluminum, titanium, tantalum, and others.

In various embodiments, the sacrificial capping layer 110 may have a thickness ranging from 0.5 nm to about 10 nm on the top of the contact cap 108. In one embodiment, the sacrificial capping layer 110 may have a thickness ranging from 2 nm to about 5 nm.

In one embodiment of the semiconductor device 100, the sacrificial capping layer 110 is formed using a vapor phase deposition process, for example an atomic layer deposition (ALD) process, a chemical vapor deposition process such as metal-organic CVD (MOCVD) and other such processes.

In one embodiment, the preferential deposition of the sacrificial capping layer 110 on the top of the RMG stack 102' may be achieved using an ALD process and processing conditions that reduce diffusion of the reactant gases into the trenches or recessed features between the plurality of RMG stacks 102'. Processing conditions can include concentrations of the reactant gases, gas exposure times, substrate temperature, and substrate rotation speed. In one example, the substrate may be rotated during the gas exposures and the rotation speed optimized for achieving the desired preferential deposition. In some examples, a higher rotation speed can result in increased preferential deposition on the top of the RMG stack 102'. Thus, the shape of the sacrificial capping layer 110 is tunable and the sacrificial capping layer 110 may have a first thickness on top of the replacement metal gate stack and a second thickness on the etch stop layer, the first thickness being greater than the second thickness.

In one example, a sacrificial capping layer 110 containing $TiO_2$ that is preferentially deposited on the top of the RMG stack 102' may be deposited by ALD using sequential exposures of titanium tetrakis(dimethylamido)titanium (TD-MAT) and ozone ($O_3$) at a process pressure between about 1 Torr and about 3 Torr, a substrate temperature between about 100° C. and about 150° C., and a rotation speed between about 10 RPM and about 50 RMP.

Figure 7A:
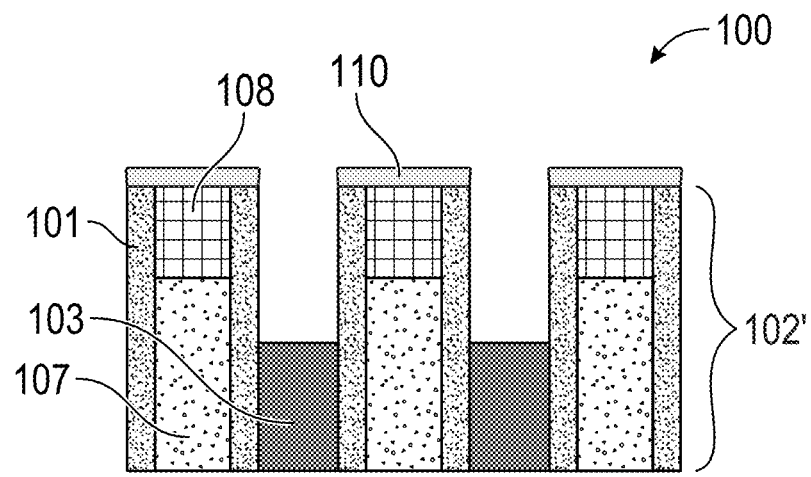
FIGS. 7A-7B illustrate cross sectional fin and gate views respectively of the semiconductor device during a subsequent stage of fabrication, in accordance with an example embodiment of the present disclosure.
Figure 7B:
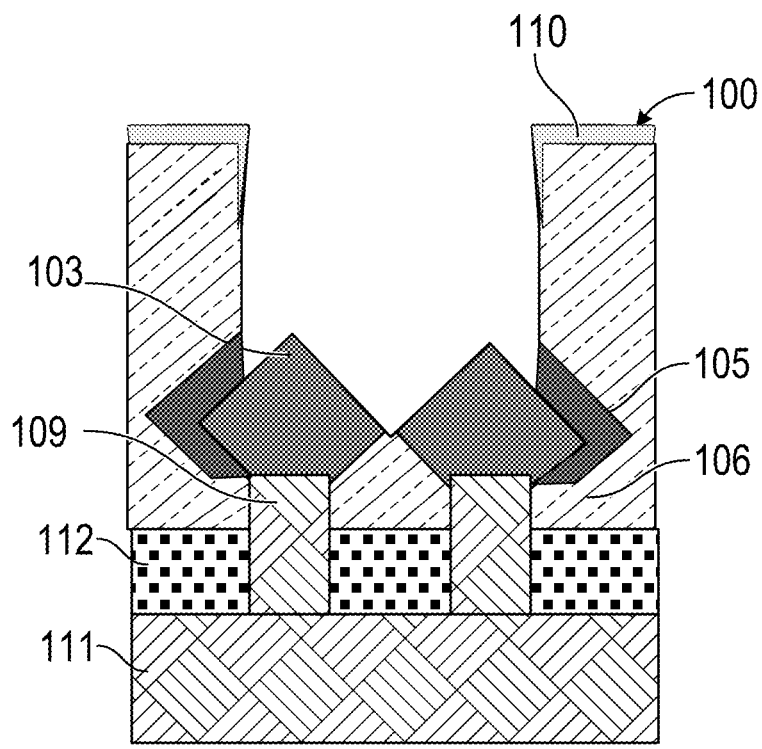

FIGS. 7A-7B illustrate partial cross sectional views of the semiconductor device 100 during a next stage of fabrication, after performing a ESL etching process, in accordance with an embodiment of the present invention. FIG. 7A illustrates a cutline similar to FIG. 1A while FIG. 7B illustrates a cutline similar to FIG. 1B.

The ESL etching process removes the remaining ESL 105 on the plurality of spacers 101 that line the replacement gate material 107 and the contact cap 108.

In various embodiments, the remaining ESL 105 is removed using a plasma process such as a reactive ion etching (RIE) process. The RIE process can have poor etch selectivity to the contact cap 108 and the spacers 101 and the sacrificial capping layer 110 protects the contact cap 108 and the underlying plurality of spacers 101 from plasma damage during the highly anisotropic ME process.

Figure 8A:
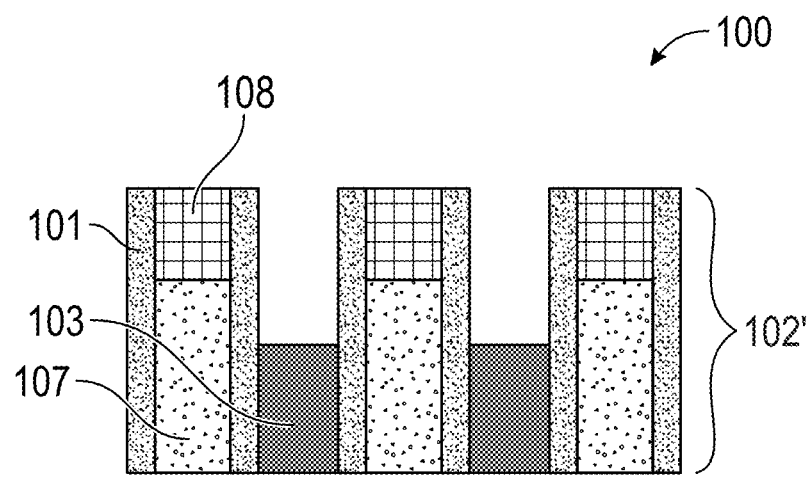
FIGS. 8A-8B illustrate partial cross sectional views of the semiconductor device 100 during a next stage of fabrication, after removing the sacrificial capping layer 110, in accordance with an example embodiment of the present disclosure.
Figure 8B:
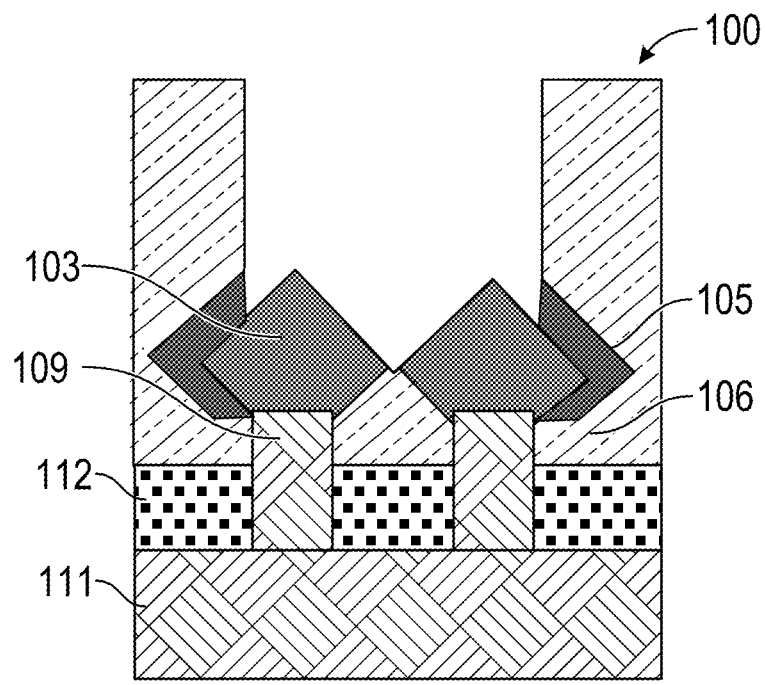

FIGS. 8A-8B illustrate partial cross sectional views of the semiconductor device 100 during a next stage of fabrication, after removing the sacrificial capping layer 110, in accordance with an embodiment of the present invention. FIG. 8A illustrates a cutline similar to FIG. 1A while FIG. 8B illustrates a cutline similar to FIG. 1B.

The removal of the sacrificial capping layer 110 may be performed by an etching process, for example wet etching, that is efficient and does not damage the contact cap 108, the plurality of spacers 101, and the epitaxial regions 103. In one example, wet etching can include a sulfuric peroxide mix (SPM) between about 70° C. and about 110° C.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method comprising:
   providing a substrate comprising a plurality of metal gate stacks and a plurality of source/drain contact regions in alternating arrangement along a surface of the substrate with a dielectric spacer separating each source/drain contact region from an adjacent metal gate stack, wherein each of the source/drain regions is recessed within an opening between adjacent metal gates stacks such that the source/drain contact regions provide a bottom of the recess and the dielectric spacers provide sidewalls of the recess;
   forming an etch stop layer on the substrate such that the etch stop layer conformally covers the plurality of metal gate stacks, the sidewalls of each recess and the bottom of each recess;
   forming a sacrificial layer over each of the metal gate stacks and on at least a portion of each sidewall of each recess;
   removing the etch stop layer from the bottom of each recess while the sacrificial layer remains on at least a portion of each sidewall of each recess to expose the source/drain contact; and
   removing the sacrificial layer from each of the metal gate stacks and from the sidewalls of each recess.

2. The method of claim 1, wherein the forming a sacrificial layer comprises forming the sacrificial layer having a first thickness on top of each metal gate stack and a second thickness on the sidewalls of each recess, the first thickness being greater than the second thickness.

3. The method of claim 1, wherein the forming a sacrificial layer comprises forming the sacrificial layer on each sidewall such that a thickness of the sacrificial layer decreases from the upper portion of the recess toward the bottom of the recess.

4. The method of claim 1, wherein the forming a sacrificial layer comprises preferentially forming the sacrificial layer on top of each metal gate stack relative to sidewalls of each recess.

5. The method of claim 4, wherein the preferentially forming the sacrificial layer comprises performing an atomic layer deposition (ALD) process under processing conditions that reduce diffusion of reactant gases into the recesses.

6. The method of claim 5, wherein the processing conditions comprise at least one of concentrations of the reactant gases, gas exposure times, substrate temperature, and substrate rotation speed.

7. The method of claim 4, wherein the preferentially forming the sacrificial layer comprises rotating the substrate while exposing the substrate to gas for forming the sacrificial layer.

8. The method of claim 7, further comprising setting a rotation speed of the substrate to provide a predetermined preferential deposition of the sacrificial layer on a top of each metal gate stack.

9. The method of claim 1, wherein the forming an etch stop layer comprises forming a layer comprising silicon nitride, silicon oxide, or silicon oxynitride.

10. The method of claim 1, wherein the forming a sacrificial layer comprises forming a layer comprising a metal oxide (MOx), a metal nitride (MNx), or a metal oxynitride.

11. The method of claim 4, wherein the preferentially forming a sacrificial layer comprises forming a sacrificial capping layer having a thickness ranging from 0.5 nm to about 10 nm on the top of each metal gate stack.

12. The method of claim 11, wherein the preferentially forming a sacrificial layer comprises forming a sacrificial capping layer having a thickness ranging from 2 nm to about 5 nm on the top of each metal gate stack.

13. A method comprising:
   providing a substrate comprising a source/drain contact region, a replacement metal gate stack, a spacer on a sidewall of the replacement metal gate stack, and an etch stop layer on the spacer;
   forming a sacrificial capping layer on the replacement metal gate stack, the sacrificial capping layer having a first thickness on top of the replacement metal gate stack and a second thickness on the etch stop layer, the first thickness being greater than the second thickness, the sacrificial capping layer being formed on only a portion of the replacement metal gate stack such that an exposed portion of the etch stop layer is exposed;
   removing the exposed portion of the etch stop layer using a plasma etching process while the sacrificial capping layer remains on the etch stop layer; and
   removing the sacrificial capping layer.

14. The method of claim 13, wherein the etch stop layer contains silicon nitride, silicon oxide, or silicon oxynitride.

15. The method of claim 13, wherein the sacrificial capping layer includes a metal oxide (MOx), a metal nitride (MNx), or a metal oxynitride.

16. The method of claim 13, wherein the sacrificial capping layer includes AlN, TiN, or TiOx.

17. The method of claim 13, wherein the substrate is rotated during the forming of the sacrificial capping layer.

18. The method of claim 13, wherein removing the sacrificial capping layer includes using a wet etch chemistry.

19. A method comprising:
   providing a substrate comprising a source/drain contact region, a replacement metal gate (RMG) stack, a low-k spacer on a sidewall of the replacement metal gate stack, and an etch stop layer on the spacer;
   forming a sacrificial capping layer containing TiO2 on the replacement metal gate stack, the sacrificial capping layer having a first thickness on top of the replacement metal gate stack and a second thickness on the etch stop layer, the first thickness being greater than the second thickness, the sacrificial capping layer being formed on only a portion of the replacement metal gate stack such that an exposed portion of the etch stop layer is exposed;

removing the exposed portion of the etch stop layer using a plasma etching process while the sacrificial capping layer remains on the etch stop layer; and removing the sacrificial capping layer using wet etch chemistry.

20. The method of claim 19, wherein the forming a sacrificial capping layer comprises preferentially deposited on the top of each RMG stack by atomic layer deposition (ALD) using sequential exposures of titanium tetrakis(dimethylamido)titanium (TDMAT) and ozone (O3) at a process pressure between about 1 Torr and about 3 Torr, a substrate temperature between about 100° C. and about 150° C., and a substrate rotation speed between about 10 RPM and about 50 RPM.

* * * * *